United States Patent
Hwang

(10) Patent No.: US 9,087,610 B2
(45) Date of Patent: Jul. 21, 2015

(54) SEMICONDUCTOR MEMORY DEVICE, SEMICONDUCTOR MEMORY MODULE AND OPERATION METHODS THEREOF

(71) Applicant: SK hynix Inc., Gyeonggi-do (KR)

(72) Inventor: Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 72 days.

(21) Appl. No.: 14/106,812

(22) Filed: Dec. 15, 2013

(65) Prior Publication Data

US 2015/0124542 A1    May 7, 2015

(30) Foreign Application Priority Data

Nov. 4, 2013    (KR) .................. 10-2013-0132845

(51) Int. Cl.
    *G11C 29/00*    (2006.01)
    *G11C 29/02*    (2006.01)
    *G11C 29/18*    (2006.01)

(52) U.S. Cl.
    CPC .............. *G11C 29/027* (2013.01); *G11C 29/18* (2013.01); *G11C 29/787* (2013.01)

(58) Field of Classification Search
    CPC .... G11C 29/027; G11C 29/18; G11C 29/787; G11C 2029/0407
    USPC ........... 365/200, 185.02, 185.09, 201, 230.08
    See application file for complete search history.

(56) References Cited

U.S. PATENT DOCUMENTS

| | | | | |
|---|---|---|---|---|
| 6,067,260 A * | 5/2000 | Ooishi et al. | | 365/200 |
| 6,538,924 B2 * | 3/2003 | Dono et al. | | 365/185.08 |
| 6,930,935 B2 * | 8/2005 | Nanba et al. | | 365/200 |
| 7,859,938 B2 * | 12/2010 | Matsubara | | 365/233.1 |
| 2007/0047347 A1 * | 3/2007 | Byun et al. | | 365/201 |
| 2008/0089160 A1 * | 4/2008 | Dono et al. | | 365/225.7 |

FOREIGN PATENT DOCUMENTS

KR    1020110056453    5/2011

\* cited by examiner

*Primary Examiner* — Tan T. Nguyen
(74) *Attorney, Agent, or Firm* — IP & T Group LLP

(57) ABSTRACT

An operation method of a semiconductor memory device including a fuse array for storing one or more repair addresses includes latching additionally a repair address having an address value, which is not stored in the fuse array in response to an active command signal during a repair operation mode, receiving a repair entry control code from an external device in response to a first column command signal during the repair operation mode, performing a rupture operation of the repair address, which is latched, in response to a second column command signal, wherein the rupture operation is determined based on a value of a repair entry control code, and performing exit of the repair operation mode in response to a precharge command signal, which is provided after the second column command signal.

23 Claims, 5 Drawing Sheets

SEMICONDUCTOR MEMORY DEVICE, SEMICONDUCTOR MEMORY MODULE AND OPERATION METHODS THEREOF

CROSS-REFERENCE TO RELATED APPLICATIONS

The present application claims priority of Korean Patent Application No, 10-2013-0132845, filed on Nov. 4, 2013, which is incorporated herein by reference in its entirety,

BACKGROUND

1. Field

Exemplary embodiments of the present invention relate to a semiconductor design technology, and more particularly, to a semiconductor memory device, a semiconductor memory module including the same for performing a repair operation, and operation methods thereof.

2. Description of the Related Art

A semiconductor device or a semiconductor memory device includes a fuse circuit for internally setting or programming a repair address. A fuse included in the fuse circuit stores an address and a specific setting information through a fuse programming. An electrical resistance value of the fuse is changed through change of an electrical characteristic of the fuse by a laser beam or an electrical stress. The specific setting information may be programmed using a change of an electrical coupling state, e.g., a short state or an open state.

A repair operation of the semiconductor memory device is performed during a fabrication process of the semiconductor memory device. However, after the semiconductor memory device is fabricated, an error may occur in the semiconductor memory device packaged and ready to be used. Thus, it may be necessary to perform a repair operation after the semiconductor memory device is fabricated and mounted on an electronic device.

SUMMARY

Various exemplary embodiments of the present invention are directed to a repair test operation to a semiconductor memory device after packaging using a normal memory access protocol.

In accordance with an exemplary embodiment of the present invention, an operation method of a semiconductor memory device including a fuse array for storing one or more repair addresses may include latching additionally a repair address having an address value, which is not stored in the fuse array in response to an active command signal during a repair operation mode, receiving a repair entry control code from an external device in response to a first column command signal during the repair operation mode, performing a rupture operation of the repair address, which is latched, in response to a second column command signal, wherein the rupture operation is determined based on a value of a repair entry control code, and performing exit of the repair operation mode in response to a precharge command signal, which is provided after the second column command signal.

In accordance with an exemplary embodiment of the present invention, an operation method of the semiconductor module including a plurality of semiconductor memory devices having a fuse array for storing one or more repair addresses may include latching additionally a repair address having an address value, which is not stored on the fuse array, in the plurality of semiconductor memory devices in response to an active command signal provided to the plurality of semiconductor memory devices during a repair operation mode, receiving commonly a repair entry control code from an external device in response to a first column command signal provided to the plurality of semiconductor memory devices during the repair operation mode, performing a rupture operation of the repair address, which is latched, on the fuse array in response to a second column command signal in a selected semiconductor memory device of the plurality of semiconductor memory devices based on the repair entry control code, and performing exit of the repair operation mode in response to a precharge command signal provided to the plurality of semiconductor memory devices.

In accordance with an exemplary embodiment of the present invention, a semiconductor memory device may include a mode register set suitable for determining whether or not a repair operation is entered in response to exit of a power-up operation period, a fuse array suitable for storing one or more repair addresses, a repair address latch unit suitable for additionally latching a repair address having an address value, which is not stored in the fuse array in response to an active command signal during the repair operation mode, a repair code input unit suitable for receiving a repair entry control code from an external device in response to a first column command signal during the repair operation mode, an operation determination unit suitable for determining whether the repair entry control code has a predetermined value, and generating a rupture enable signal based on a determined result during the repair operation mode, a rupture operation unit suitable for performing a rupture operation of the repair address, which is latched in the repair address latch unit, on the fuse array in response to the rupture enable signal and a second column command signal during the repair operation mode, and an operation control unit suitable for controlling exit of the repair operation mode in response to a precharge command signal.

In accordance with an exemplary embodiment of the present invention, an operation method of a semiconductor memory device including a fuse array having one or more stored repair addresses may include providing a new repair address to the fuse array in response to a first memory command, determining whether or not to perform a rupture operation based on a device identification code input in response to a second memory command, performing the rupture operation with the new repair address based on the result of the determining in response to a third memory command and quitting the repair operation in response to a fourth memory command, wherein the first to fourth memory command are sequentially provided to the semiconductor memory device.

The first memory command may be an active command.

Each of the second and third memory commands may be one of a write command and a read command.

The fourth memory command may be a precharge command.

The new repair address may be provided from an external.

The new repair address may be internally generated.

In accordance with an exemplary embodiment of the present invention, an operation method of the semiconductor module including a plurality of semiconductor memory devices, each of which includes a fuse array having one or more stored repair addresses may include providing a new repair address to the fuse array of each of the semiconductor memory devices in response to a first memory command, determining which one of the semiconductor memory device is to perform a rupture operation based on a device identification code input to each of the semiconductor memory devices in response to a second memory command, allowing one of the semiconductor memory device to perform the rupture operation with the new repair address based on the result of the determining in response to a third memory command and quitting the repair operation in response to a fourth memory command, wherein the first to fourth memory command are sequentially provided to the semiconductor memory device.

In accordance with an exemplary embodiment of the present invention, a semiconductor memory device may include a fuse array having one or more stored repair addresses, a repair address providing section suitable for providing a new repair address to the fuse array in response to a first memory command, a determining section for determining whether or not to perform a rupture operation based on a device identification code input in response to a second memory command, a rupture operation unit for performing the rupture operation with the new repair address based on the result of the determining section in response to a third memory command and an operation control unit for controlling the fuse array to perform a boot-up operation by activating a boot-up enable signal in response to a fourth memory command, wherein the first to fourth memory command are sequentially provided to the semiconductor memory device.

DETAILED DESCRIPTION

Figure 1:
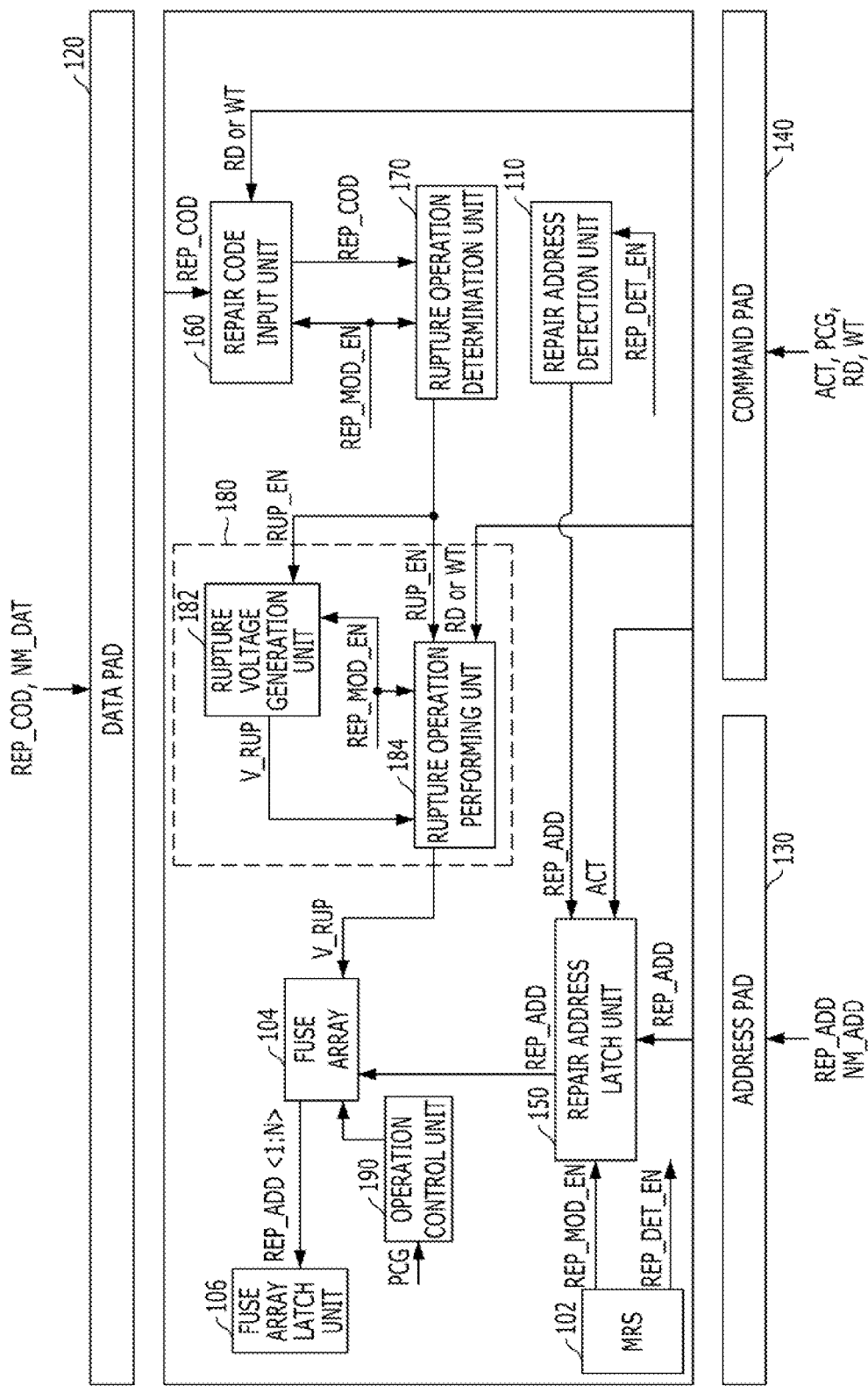
FIG. 1 is a block diagram illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a block diagram illustrating a semiconductor memory device in accordance with an exemplary embodiment of the present invention.

Referring to FIG. 1, the semiconductor memory device in accordance with an exemplary embodiment of the present invention may include a memory register set (MRS) 102, a fuse array 104, a fuse array latch unit 106, a repair address detection unit 110, a data pad 120, an address pad 130, a command pad 140, a repair address latch unit 150, a repair code input unit 160, a rupture operation determination unit 170, a rupture operation unit 180 and an operation control unit 190.

The MRS 102 may determine the entry of a repair operation mode in response to the exit of a power up operation period. More specifically, the MRS 102 may control a repair mode enable signal REP_MOD_EN for the repair operation mode at the end of the power up operation. The repair operation mode may represent a rupture operation of a repair address REP_ADD on a fuse array while the normal operation may represent data communication between a memory cell and an external device, which will be described later.

When the repair mode enable signal REP_MOD_EN is activated at the end of the power up operation, the semiconductor memory device may enter the repair operation mode, perform a predetermined repair operation, and enter a normal operation mode via a boot-up operation.

When the repair mode signal REP_MOD_EN is inactivated at the end of the power up operation, the semiconductor memory device may enter the normal operation mode via the boot-up operation without the repair operation.

The fuse array 104 may store one or more repair addresses REP_ADD including first and second repair addresses. The first repair address may be preset during a fabrication process of a semiconductor memory device. The second repair address may be additionally inputted during the repair operation mode. During the boot-up operation, one or more repair addresses REP_ADD may be read and latched before the normal operation mode is entered.

The repair address latch unit 150 may latch the second repair address or a repair address REP_ADD having a value, which is not stored in the fuse array 104. The repair address REP_ADD may be transmitted from an external device or generated during a repair detection mode, which means that the semiconductor memory device detects an error cell of a memory cell array. When an active command signal ACT is applied during the repair operation mode, the repair address latch unit 150 may latch the repair address REP_ADD in response to the active command signal ACT. The repair address latch unit 150 in response to the active command signal ACT during the repair operation mode may latch and output the second repair address or the repair address REP_ADD, which is obtained during the repair detection mode prior to the repair operation mode, to the fuse array 104.

Herein, the repair address REP_ADD may be obtained through two manners as explained below.

According to a first manner, the repair address REP_ADD may be obtained through external input from an external device (not shown) to the address latch unit 250. The external device may determine based on data communication between the external device and the semiconductor memory device whether a memory cell of a cell array of the semiconductor memory device has failed or not. The external device may generate and transmit the repair address REP_ADD to the semiconductor memory device for replacing a failed cell. The repair address latch unit 150 may latch the repair address REP_ADD transferred from the external device.

According to a second manner, the semiconductor memory device during the repair detection mode may detect a failed cell and generate the repair address REP_ADD. The repair detection mode may be performed prior to the repair operation. For example, the repair detection mode may be entered in response to an activation of the repair detection enable signal REP_DET_EN through the setting of the MRS. During the repair detection mode, the semiconductor memory device may detect a failed cell based on whether or not data is normally stored in a memory cell array without an error and generate the repair address REP_ADD. More specifically, the repair address detection unit 110 of the semiconductor memory device may generate the repair address REP_ADD in response to the repair detection enable signal REP_DET_EN.

The operation control unit 190 may control the end of the repair operation mode of the semiconductor memory device in response to a precharge command signal PCG. The operation control unit 190 may control the fuse array 104 to perform the boot-up operation by activating a boot-up enable signal in response to the precharge command signal PCG received through the command pad 140.

The fuse array latch unit 106 during the boot-up operation period may read and latch one or more repair addresses REP_ADD<1:N> stored in the fuse array 104. The repair addresses REP_ADD<1:N> latched in the fuse array latch unit 106 may be used during the normal operation mode.

When the operation control unit 190 activates the boot-up enable signal, the fuse array 104 may perform the boot-up operation in response to the boot-up enable signal. Thus, the fuse array latch unit 106 may read the first repair address, which is originally stored on the fuse array 104, and the second repair address, which is additionally obtained by the repair address latch unit 150 prior to the repair operation mode and ruptured on the fuse array 104 during the repair operation mode.

The repair code input unit 160 may transfer a repair entry control code REP_COD from the external device through the data pad 120 to the rupture operation determination unit 170 in response to a first column command signal WT or RD during the repair operation mode and the activation of the repair node enable signal REP_MOD_EN.

The rupture operation determination unit 170 may determine whether the repair entry control code REP_COD has a predetermined value or not during the repair operation mode and generate a rupture enable signal RUP_EN based on a determined result. The repair entry control code REP_COD may be an identification code for the semiconductor memory device and the predetermined value may represent a specific semiconductor memory device and may be preset. In the repair operation mode according to the activation of the repair mode enable signal REP_MOD_EN, if the repair entry control code REP_COD has the predetermined value or indicates the semiconductor memory device, the rupture operation determination unit 170 may output an activated rupture enable signal RUP_EN. Otherwise, the rupture operation determination unit 170 may output a deactivated rupture enable signal RUP_EN.

The rupture operation unit 180 during the repair operation mode may rupture the repair address REP_ADD obtained by the repair address latch unit 150 and stored in the fuse array 104 in response to the activated rupture enable signal RUP_EN and a second column command signal WT or RD.

As described above, the first column command WT or RD may be involved with the repair entry control code REP_COD and the repair code input unit 160 while the second column command signal WT or RD may be involved with generation of a rupture bias voltage V_RUP and the rupture operation unit 180 to rupture the repair address REP_ADD with the rupture bias voltage V_RUP.

The repair code input unit 160 during the repair operation mode may transfer the repair entry control code REP_COD once and thus the first column command signal WT or RD may be provided to the repair code input unit 160 once. In the other hand, the rupture operation unit 180 may repeatedly perform the rupture operation with the repair address REPADD according to the number of bits of the repair address REP_ADD and thus the second column command signal WT or RD is repeatedly provided to the rupture operation unit 180 by an amount of times corresponding to the number of bits of the repair address REP_ADD.

Each of the first and second column commands WT or RD may be one selected from a write command signal WT and a read command signal RD.

The rupture operation unit 180 may include a rupture voltage generation unit 182 and a rupture operation performing unit 184.

The rupture voltage generation unit 182 during the repair operation mode may generate the rupture bias voltage V_RUP in response to the activation of the rupture enable signal RUP_EN.

The rupture operation performing unit 184 during the repair operation mode may rupture the repair address REP_ADD obtained by the repair address latch unit 150 and stored in the fuse array 104 by providing the rupture bias voltage V_RUP outputted from the rupture voltage generation unit 182 to the fuse array 104 in response to the second column command signal WT or D.

It is preferred that a time gap is secured between inputs of the first column command signal WT or RD and an input time of the second column command signal WT or RD for generation of the rupture bias voltage V_RUP.

The command pad 140 may receive the active command signal ACT, the precharge command signal PCG, the first column command signal WT or RD and the second column command signal WT or RD during the normal operation mode and the repair operation mode. The address pad 130 may receive a normal address (not shown) during the normal operation mode and receive the repair address REP_ADD during the repair operation mode. When the repair address detection unit 110 generates additionally the repair address REP_ADD, the address pad 130 may not be used in the repair operation mode. The data pad 120 may be used for inputting or outputting the normal data during the normal operation mode and for receiving the repair entry control code REP_COD during the repair operation mode.

Figure 2:
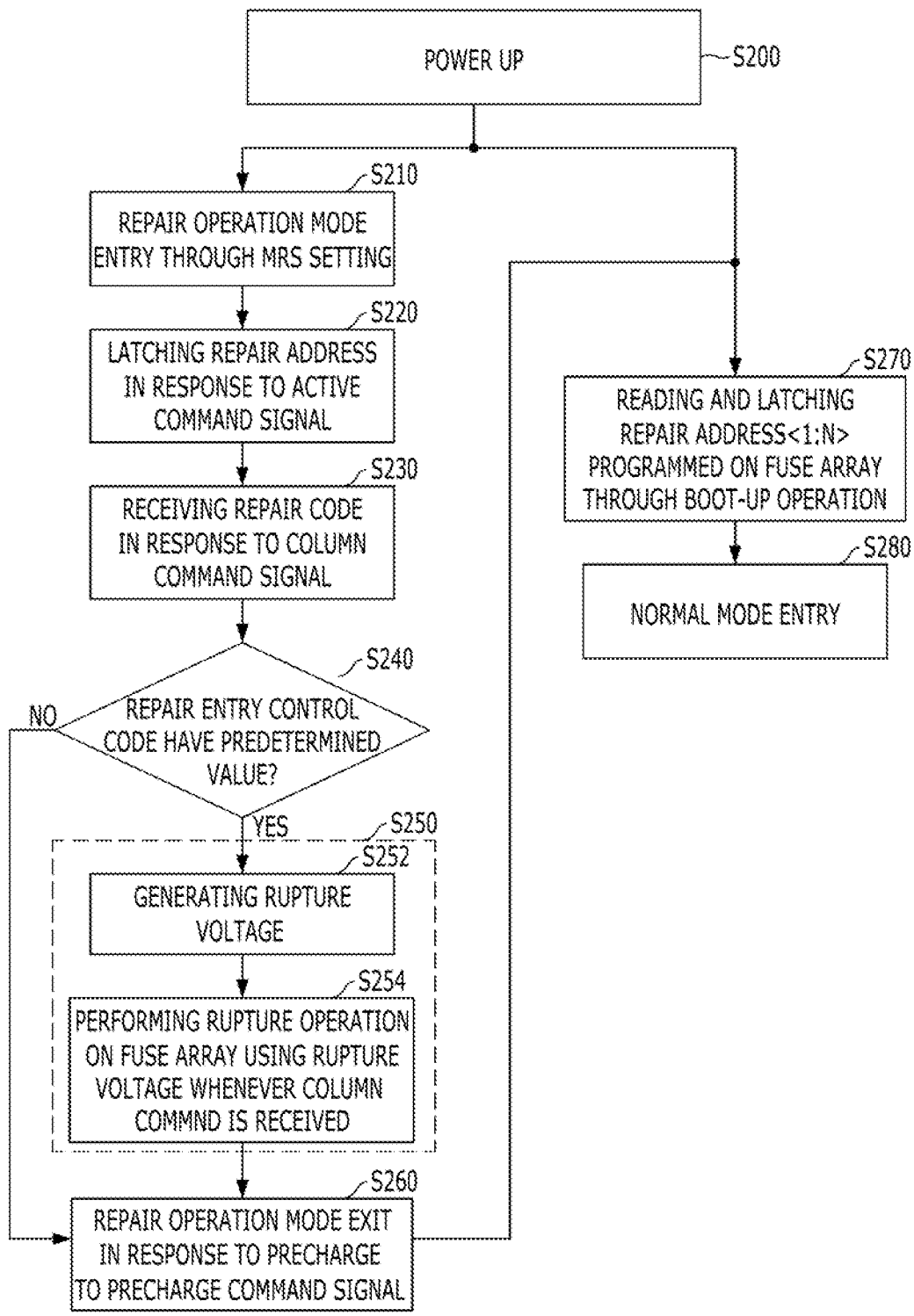
FIG. 2 is a flow chart illustrating an operation method of the semiconductor memory device shown in FIG. 1 in accordance with an exemplary embodiment of the present invention.

FIG. 2 is a flow chart illustrating an operation method of the semiconductor memory device shown in FIG. 1 in accordance with an exemplary embodiment of the present invention.

Referring to FIGS. 1 and 2, in a step 210, the semiconductor memory device may enter the repair operation mode in response to activation of the repair mode enable signal REP_MOD_EN of the MRS 102 or, as shown in steps S270 and S280 of FIG. 2, may just enter the normal operation mode through a boot-up operation without the repair operation at the end of the power up operation of a step S200.

In the step S220, the repair address REP_ADD may be latched by the repair address latch unit 150 in response to an active command signal ACT. As described above with reference to FIG. 1, the repair address latch unit 150 in response to the active command signal ACT during the repair operation mode may latch and output the second repair address or the repair address REP_ADD, which is obtained during the repair detection mode prior to the repair operation mode, to the fuse array 104.

In the step S230, the repair code input unit 160 may receive a repair entry control code REP_COD from the external device.

In the step S240, it is determined by the rupture operation determination unit 170 whether the repair entry control code REP_COD has the predetermined value or indicates the semiconductor memory device. If the repair entry control code REP_COD has the predetermined value, the repair address REP_ADD, which is latched by the repair address latch unit 150 at the step S220, is ruptured in response to the second column command signal WT or RD in a step S250. Otherwise, the repair operation mode exits in a step S260.

As a detailed process of the step S250, in a step S252, the rupture bias voltage V_RUP may be generated by the rupture voltage generation unit 182 prior to the rupture operation.

In a step S254, whenever the second column command signal WT or RD is received, the rupture bias voltage V_RUP may be provided to the fuse array 104 by the rupture operation performing unit 184 and used for rupturing the repair address REP_ADD, which is obtained during the repair detection mode prior to the repair operation mode and latched and provided to the fuse array 104 at the step S220. That is, the rupture operation is performed by adjusting the number of application times of the rupture bias voltage V_RUP to the fuse array 104 according to the second column command signal WT or RD.

In a step S260, when the precharge command signal PCG is provided after the second column command signal WT or RD is received, the repair operation mode exits. The exit of the repair operation mode represents that the normal operation mode is entered in a step S280 after the boot-up operation is performed in a step S270. That is, after the exit of the repair operation mode is performed in response to the precharge command signal PCG, the boot-up operation is performed and the normal operation mode entry is performed. Thus, the repair address, which is ruptured during the repair operation mode, is read and is used in the normal operation mode.

Figure 3:
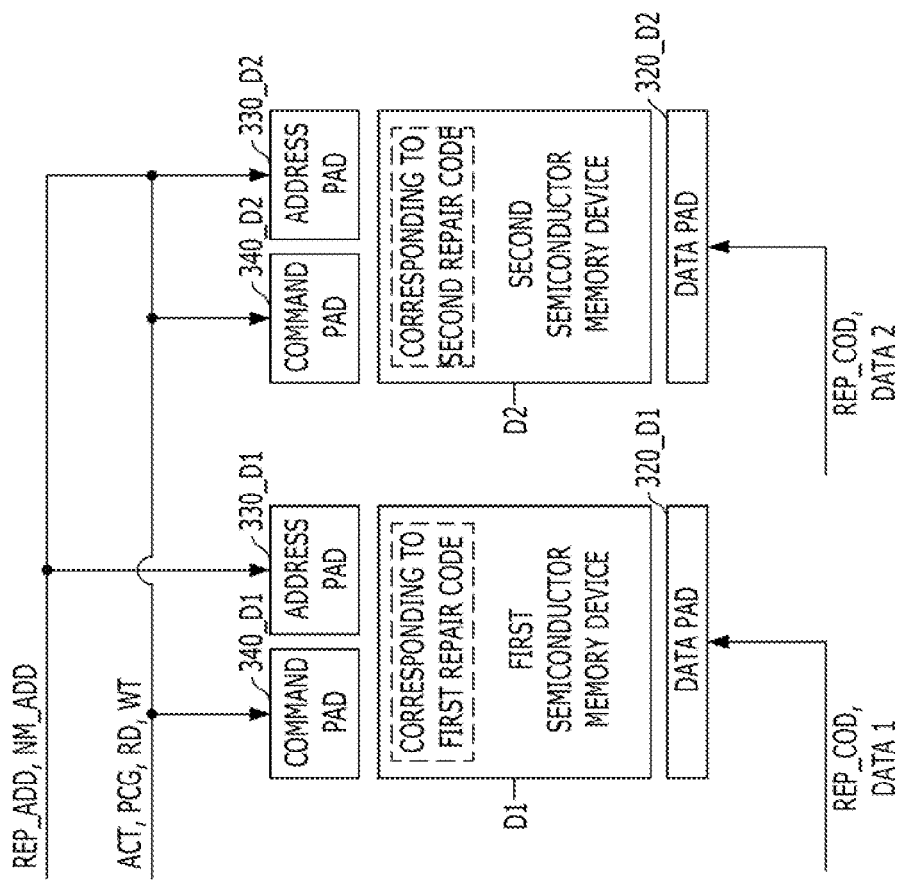
FIG. 3 is a block diagram illustrating a semiconductor module in accordance with an exemplary embodiment of the present invention.

FIG. 3 is a block diagram illustrating a semiconductor module in accordance with an exemplary embodiment of the present invention.

Referring to FIG. 3, the semiconductor module may include first and second semiconductor memory devices D1 and D2. Each of the first and second semiconductor memory devices D1 and D2 may be the same as the semiconductor memory device shown in FIG. 1. When a value of the repair entry control code REP_COD provided from the external device corresponds to a value of one of first and second repair entry control codes, which means that the repair entry control code REP_COD indicates one of the first and second semiconductor memory devices D1 and D2, the one of the first and second semiconductor memory devices D1 and D2 indicated to be the repair entry control code REP_COD may perform the rupture operation while the other one may not.

For example, if the repair entry control code REP_COD provided from the external device has the value of the first repair entry control code corresponding to the first semiconductor memory device D1, the first semiconductor memory device D1 may perform the rupture operation while the other semiconductor memory device D2 may not.

Figure 4:
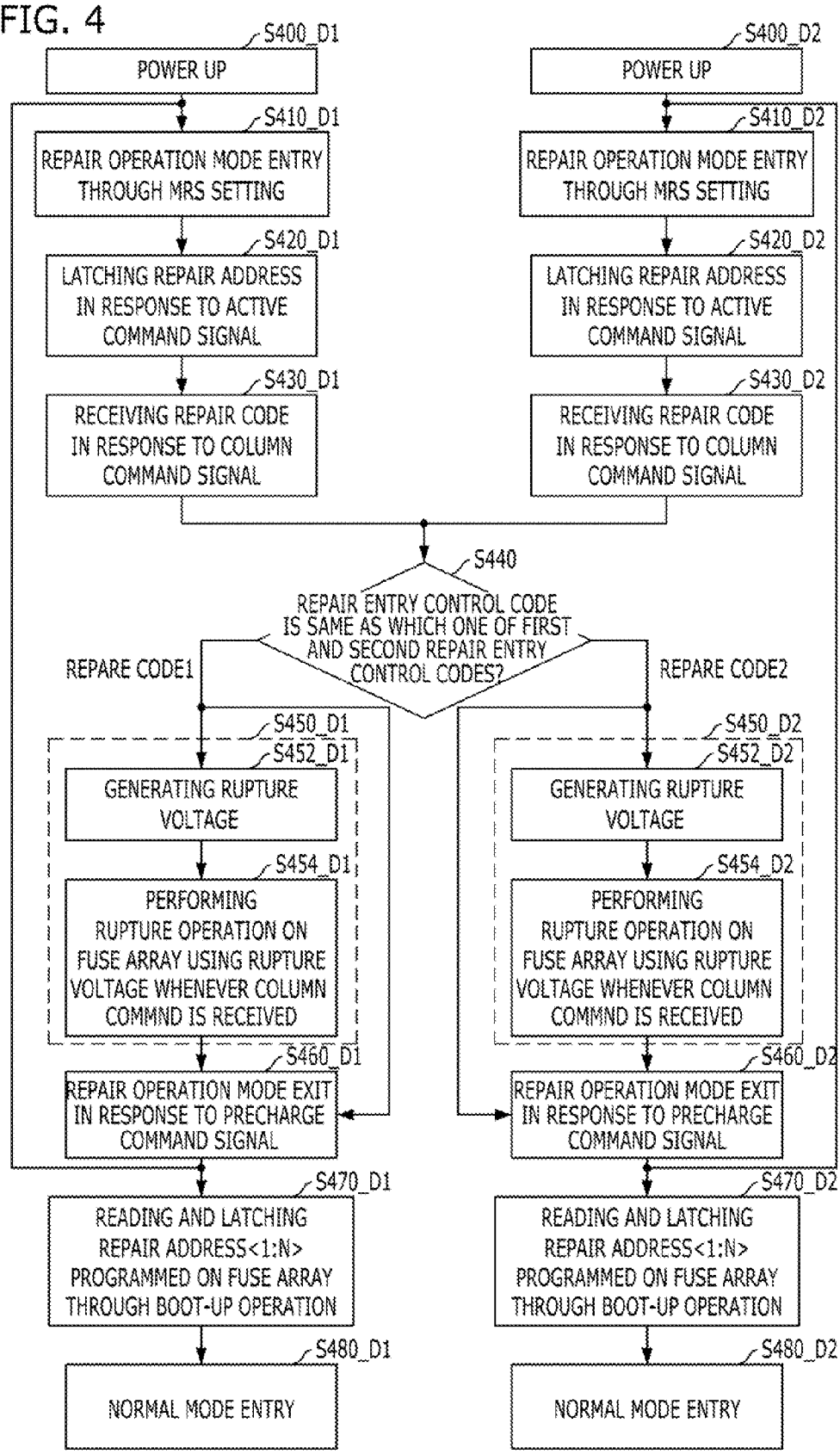
FIG. 4 is a flow chart illustrating an operation method of the semiconductor module shown in FIG. 3 in accordance with an exemplary embodiment of the present invention.

FIG. 4 is a flow chart illustrating an operation method of the semiconductor module shown in FIG. 3 in accordance with an exemplary embodiment of the present invention.

Referring to FIGS. 3 and 4, in the steps S410_D1 and S410_D2, the first and second semiconductor memory devices D1 and D2 may selectively enter the repair operation mode in response to activation of the repair mode enable signal REP_MOD_EN of the MRS 102 included in each of the first and second semiconductor memory devices D1 and D2 or, as shown in steps S470_D1 and S480_D1 and S470_D2 and S480_D2 of FIG. 4, may just enter the normal operation mode through a boot-up operation without the repair operation at the end of the power up operation of steps S400_D1 and S400_D2.

In the steps S420_D1 and S420_D2, the repair address REP_ADD may be latched by the repair address latch unit 150 in response to an active command signal ACT. As described above with reference to FIG. 1, the repair address latch unit 150 during the repair operation mode may latch and output the second repair address or the repair address REP_ADD, which is obtained during the repair detection mode prior to the repair operation mode, to the fuse array 104.

Herein, a value of the repair address REP_ADD latched in the first semiconductor memory device D1 may be the same as a value of the repair address REP_ADD latched in the second semiconductor memory device D2.

In the steps S430_D1 and S430_D2, the repair code input unit 160 in each of the first and second semiconductor memory devices D1 and D2 may receive a repair entry control code REP_COD from the external device in response to the first column command WT or RD.

In the step S440, when the value of the repair entry control code REP_COD corresponds to the value of the one of first and second repair entry control codes, which means that the repair entry control code REP_COD indicates one of the first and second semiconductor memory devices D1 and D2, it is determined that one of the first semiconductor memory device D1 and the second semiconductor memory device D2 indicated by the repair entry control code REP_COD may perform the rupture operation while the other one may not.

For example, if the repair entry control code REP_COD has a predetermined first repair entry control code REP_COD1, the first semiconductor memory device D1 may perform the rupture operation in the step S350_D1 while the second semiconductor memory device D2 may skip the rupture operation and perform the exit of the repair operation mode in the step S460_D2. Otherwise, the second semiconductor memory device D2 may perform the rupture operation in the step S450_D2 while the first semiconductor memory device D1 may skip the rupture operation and perform the exit of the repair operation mode in the step S460_D1.

As a detailed process of steps S450_D1 and S450_D2, in a step S452_D1 and S452_D2, the rupture bias voltage V_RUP may be generated by the rupture voltage generation unit 182 in each of the first and second semiconductor memory devices D1 and D2 prior to the rupture operation.

In steps S454_D1 and S454_D2, whenever the second column command signal WT or RD is received, the rupture bias voltage V_RUP may be provided to the fuse array 104 by the rupture operation performing unit 184 in, each of the first and second semiconductor memory devices D1 and D2 and used for rupturing the repair address REP_ADD, which is obtained during the repair detection mode prior to the repair operation mode and latched and provided to the fuse array 104 at the steps S420_D1 and S420_D2. That is, the rupture operation is performed by adjusting the number of application times of the rupture bias voltage V_RUP to the fuse array 104 in each of the first and second semiconductor memory devices D1 and D2 according to the second column command signal WT or RD.

In the steps S460_D1 and S460_D2, the first and second semiconductor memory devices D1 and D2 may receive the precharge command signal PCG commonly and perform the exit of the repair operation mode in response to the precharge command signal PCG.

In the steps S470_D1 and S470_D2, the first and second semiconductor memory devices D1 and D2 may read and latch one or more repair addresses REP_ADD<1:N> stored on the fuse array 104 in each of the first and second semiconductor memory devices D1 and D2 by performing the boot-up operation in response to the exit of the repair operation mode. The repair addresses REP_ADD<1:N> latched through the boot-up operation may be used in the normal operation mode in the steps S480_D1 and S480_D2.

As a result of the operation shown in FIG. 4, the additionally ruptured repair address REP_ADD to be used in the normal operation mode may be included in the selected one of the semiconductor memory device D1 or D2 indicated by the repair entry control code REP_COD at the step S440.

Figure 5:
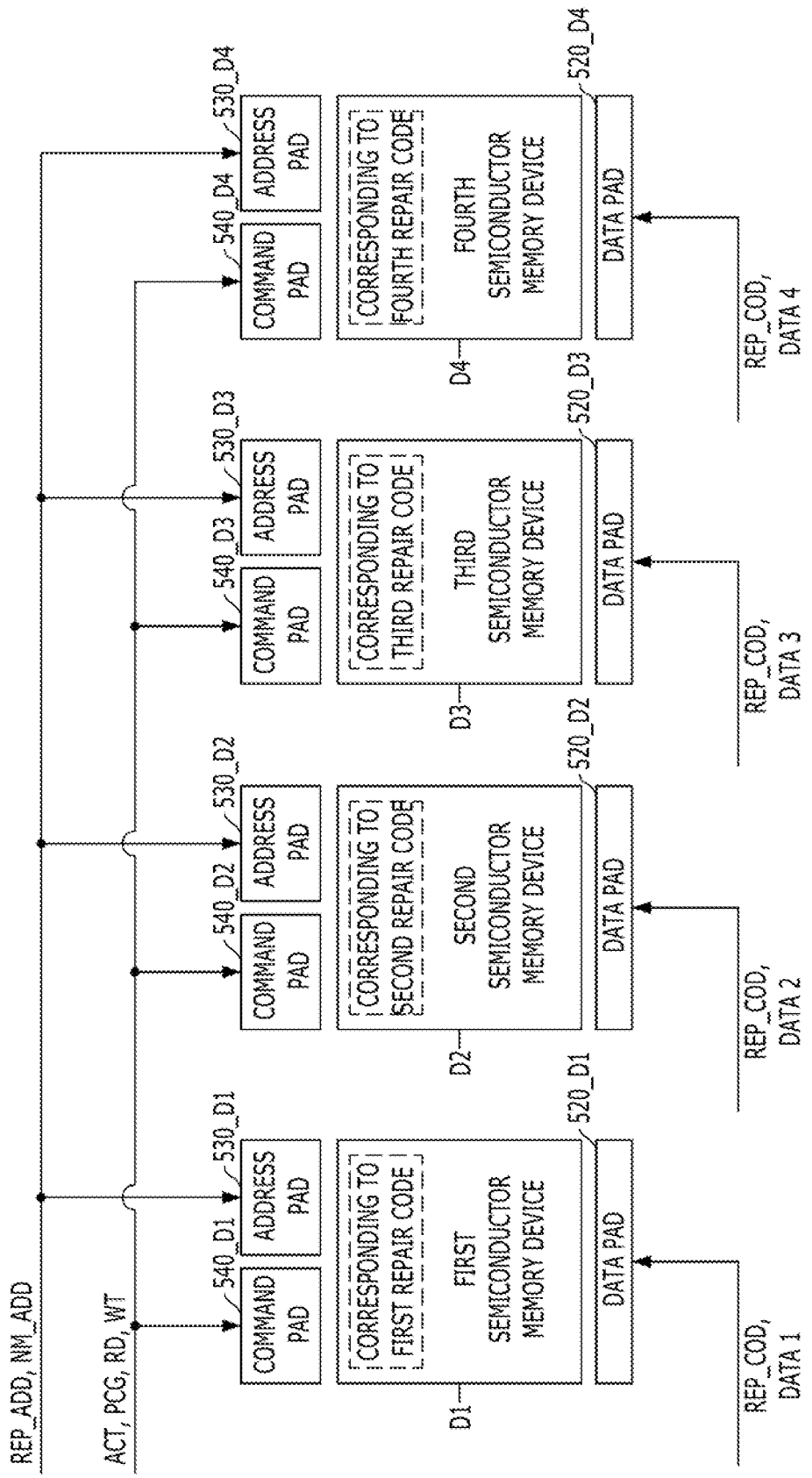
FIG. 5 is a block diagram illustrating a semiconductor module in accordance with an exemplary embodiment of the present invention.

FIG. 5 is a block diagram illustrating a semiconductor module in accordance with an exemplary embodiment of the present invention.

Referring to FIG. 5, the semiconductor module may include first to fourth semiconductor memory devices D1 to D4. Each of the first to fourth semiconductor memory devices D1 to D4 may be the same as the semiconductor memory device shown in FIG. 1. When a value of the repair entry control code REP_COD provided from the external device corresponds to a value of one of first to fourth repair entry control codes, which means that the repair entry control code REP_COD indicates one of the first to fourth semiconductor memory devices D1 to D4, the one of the first to fourth semiconductor memory devices D1 to D4 indicated to be the repair entry control code REP_COD may perform the rupture operation while the others may not.

For example, if the repair entry control code REP_COD provided from the external device has the value of the first repair entry control code corresponding to the first semiconductor memory device D1, the first semiconductor memory device D1 may perform the rupture operation while the others may not.

As described above, a repair operation may be performed even through a normal memory access protocol such as the sequence of an active command signal ACT, a write or read command signal WT or RD and a precharge command signal PCG after packaging the semiconductor memory device. That is, the semiconductor memory device may perform the repair operation by sequentially providing the normal memory access signals or the active command signal ACT, the write or read command signal WT or RD and the precharge command signal PCG to the semiconductor memory device.

Especially, the semiconductor module including a plurality of semiconductor memory devices may perform the repair operation on the selected semiconductor memory device.

Thus, although the semiconductor memory device is mounted on an electronic device or an electronic system, the semiconductor memory device may perform the repair operation through a simple operation control of a memory access protocol.

While the present invention has been described with respect to the specific embodiments, it will be apparent to those skilled in the art that various changes and modifications may be made without departing from the spirit and scope of the invention as defined in the following claims.

What is claimed is:

1. An operation method of a semiconductor memory device including a fuse array for storing one or more repair addresses, the operation method comprising:
    latching additionally a repair address having an address value, which is not stored in the fuse array, in response to an active command signal during a repair operation mode;
    receiving a repair entry control code from an external device in response to a first column command signal during the repair operation mode;
    performing a rupture operation of the repair address, which is latched, in response to a second column command signal, wherein the rupture operation is determined based on a value of a repair entry control code; and
    performing exit of the repair operation mode in response to a precharge command signal, which is provided after the second column command signal.

2. The operation method of claim 1, wherein the latching of the repair address comprises:
    during the repair operation mode, receiving the repair address having an address value, which is not stored on a fuse array, and latching the repair address in response to the active command signal; and
    detecting and generating the repair address having the address value, which is not stored on the fuse array during a repair detection mode, and latching the repair address in response to the active command signal during the repair operation mode.

3. The operation method of claim 2, wherein the active command signal, the precharge command signal, the first column command signal and the second column command signal are received through a command pad, the repair address having the address value, which is not stored on the fuse array, is received through an address pad or is generated through the repair detection mode, and the repair entry control code is received through a data pad.

4. The operation method of claim 1, further comprising:
    entering the repair operation mode through a mode register set (MRS) setting in response to the exit of a power-up operation period.

5. The operation method of claim 1, wherein the first and second column command signals are a read command signal.

6. The operation method of claim 1, wherein one of the first and second column command signals is a write command signal and the other one of the first and second column command signals is a read command signal.

7. The operation method of claim 1, wherein the first column command signal is received once and the second column command signal is repeatedly received by a number of times corresponding to a number of bits of the repair address.

8. The operation method of claim 1, the performing of the rupture operation is performed on the fuse array whenever the second column command signal is received if the repair entry control signal has the predetermined value.

9. The operation method of claim 8, wherein the performing of the rupture operation comprises:
    generating a rupture bias voltage if the repair entry control signal has the predetermined value; and
    performing the rupture operation of the repair address, which is latched, on the fuse array using the rupture bias voltage whenever the second column command is provided.

10. An operation method of the semiconductor module including a plurality of semiconductor memory devices having a fuse array for storing one or more repair addresses, the operation method comprising:

latching additionally a repair address having an address value, which is not stored on the fuse array, in the plurality of semiconductor memory devices in response to an active command signal provided to the plurality of semiconductor memory devices during a repair operation mode;

receiving commonly a repair entry control code from an external device in response to a first column command signal provided to the plurality of semiconductor memory devices during the repair operation mode;

performing a rupture operation of the repair address, which is latched, on the fuse array in response to a second column command signal in a selected semiconductor memory device of the plurality of semiconductor memory devices based on the repair entry control code; and performing exit of the repair operation mode in response to a precharge command signal provided to the plurality of semiconductor memory devices.

11. The operation method of claim 10, wherein the latching of the repair address comprises:

receiving the repair address having the address value, which is not stored on the fuse array, from an external device during the repair operation mode and latching the repair address in the plurality of semiconductor memory devices in response to the active command signal provided to the plurality of semiconductor memory devices; and detecting independently and generating the repair address during a repair detection mode and latching the repair address in the plurality of semiconductor memory devices in response to the active command signal provided to the plurality of semiconductor memory devices.

12. The operation method of claim 11, wherein the plurality of semiconductor memory devices receive the active command signal, the precharge command signal, the first column command signal and the second column command signal through a command pin coupled to a command pad, the repair address having the address value is received through the address pin coupled to the command pad of the plurality of semiconductor memory devices or is generated through the repair detection mode, and the repair entry control code is received through a plurality of data pins, which are independently coupled to data pads of the plurality of semiconductor memory devices, respectively.

13. The operation method of claim 10, further comprising:
entering the repair operation mode through a mode register set (MRS) setting in response to the exit of a power-up operation period.

14. The operation method of claim 10, wherein the first and second column command signals is a read command signal.

15. The operation method of claim 10, wherein one of the first and second column command signals is a write command signal and the other one of the first and second column command signals is a read command signal.

16. The operation method of claim 10, wherein the first column command signal is received once and the second column command signal is repeatedly received by a number of times corresponding to a number of bits of the repair address.

17. The operation method of claim 10, the performing of the rupture operation comprises:

selecting a semiconductor memory device corresponding to the repair entry control code out of the plurality of semiconductor memory devices; and in a selected semiconductor memory device, performing the rupture operation of the repair address, which is latched, on the fuse array whenever the second column command signal is received.

18. The operation method of claim 17, wherein the performing of the rupture operation comprises:

generating a rupture bias voltage in the selected semiconductor memory device; and performing the rupture operation of the repair address, which is latched, on the fuse array using the rupture bias voltage whenever the second column command is received.

19. A semiconductor memory device, comprising:
a mode register set suitable for determining whether or not a repair operation is entered in response to exit of a power-up operation period;

a fuse array suitable for storing one or more repair addresses;

a repair address latch unit suitable for additionally latching a repair address having an address value, which is not stored in the fuse array in response to an active command signal during the repair operation mode;

a repair code input unit suitable for receiving a repair entry control code from an external device in response to a first column command signal during the repair operation mode;

an operation determination unit suitable for determining whether the repair entry control code has a predetermined value and generating a rupture enable signal based on a determined result during the repair operation mode;

a rupture operation unit suitable for performing a rupture operation of the repair address, which is latched in the repair address latch unit, on the fuse array in response to the rupture enable signal and a second column command signal during the repair operation mode; and an operation control unit suitable for controlling exit of the repair operation mode in response to a precharge command signal.

20. The semiconductor memory device of claim 19, further comprising:

a repair address detection unit suitable for receiving and generating the repair address having the address value, which is not stored on the fuse array, during a repair detection mode.

21. The semiconductor memory device of claim 20, further comprising:

a command pad suitable for receiving the active command signal, the precharge command signal, the first column command signal and the second column command signal during the repair operation mode and a normal operation mode;

an address pad suitable for selectively receiving the repair address during the repair operation mode and receiving a normal address during the normal operation mode based on a detected result of the repair address detection unit; and a data pad suitable for receiving the repair entry control code during the repair operation mode and inputting or outputting a normal data during the normal operation mode.

22. The semiconductor memory device of claim 19, wherein the rupture operation unit comprises:

a rupture voltage generation unit suitable for generating a rupture bias voltage in response to an activation of the rupture enable signal during the repair operation mode; and a rupture operation performing unit suitable for performing a rupture operation of the repair address, which is latched in the repair address latch unit, on the fuse array using the rupture bias voltage whenever the second column command signal is received during the repair operation mode.

23. The semiconductor memory device of claim 19, further comprising:
a fuse array latch unit suitable for reading and latching one or more repair addresses, which is stored on the fuse array during a boot-up operation period.

* * * * *